(12) United States Patent
Bae et al.

(10) Patent No.: US 8,168,535 B2
(45) Date of Patent: May 1, 2012

(54) METHOD FABRICATING SEMICONDUCTOR DEVICE USING MULTIPLE POLISHING PROCESSES

(75) Inventors: Jun-Soo Bae, Hwaseong-si (KR); Suk-Hun Choi, Suwon-si (KR); Won-Jun Lee, Seoul (KR); Joon-Sang Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/084,657

(22) Filed: Apr. 12, 2011

(65) Prior Publication Data

US 2011/0306173 A1 Dec. 15, 2011

(30) Foreign Application Priority Data

Jun. 11, 2010 (KR) .................. 10-2010-0055667

(51) Int. Cl.
*H01L 21/44* (2006.01)

(52) U.S. Cl. .. 438/669; 438/102; 438/637; 257/E21.585

(58) Field of Classification Search ................... 438/599, 438/641, 668; 257/E21.536
See application file for complete search history.

(56) References Cited

U.S. PATENT DOCUMENTS

| 6,979,641 B2 | 12/2005 | Hermes | |
| 2008/0075844 A1* | 3/2008 | Ha et al. | 427/126.1 |

FOREIGN PATENT DOCUMENTS

| JP | 2004165434 A | 6/2004 |
| KR | 1020080009981 A | 1/2008 |

\* cited by examiner

*Primary Examiner* — Cheung Lee
(74) *Attorney, Agent, or Firm* — Volentine & Whitt, PLLC

(57) ABSTRACT

A method of fabricating a phase change memory device includes the use of first, second and third polishing processes. The first polishing process forms a first contact portion using a first sacrificial layer and the second polishing process forms a phase change material pattern using a second sacrificial layer. After removing the first and second sacrificial layers to expose resultant protruding structures of the first contact portion and the phase change material pattern, a third polishing process is used to polish the resultant protruding structures using an insulation layer as a polishing stopper layer.

20 Claims, 5 Drawing Sheets

METHOD FABRICATING SEMICONDUCTOR DEVICE USING MULTIPLE POLISHING PROCESSES

CROSS-REFERENCE TO RELATED APPLICATION

This application claims priority under 35 U.S.C. 119 to Korean Patent Application No. 10-2010-0055667 filed on Jun. 11, 2010, the subject matter of which is hereby incorporated by reference.

BACKGROUND OF THE INVENTION

Embodiments of the present inventive concept provide methods of fabricating semiconductor devices. More particularly, embodiments of the inventive concept provide relatively simplified methods of semiconductor device fabrication during which certain conventional drawbacks associated with polishing steps, (e.g., such as those used during a damascene process or contact formation process) are addressed.

So called phase change memory devices are among a collection of next-generation semiconductor memory devices replacing more conventional memory devices such as DRAMs and flash memories. A phase change memory device includes a plurality of phase change memory cells incorporating one or more phase-change material layer(s). Such phase-change material layer(s) exhibit a variable resistance according to their material state (e.g., a crystalline state verses an amorphous state). Using this property, the phase change memory cells may be programmed by applying certain heating profiles (e.g., passing a defined current for a defined period of time) to the phase-change material layer(s).

As ever, there is great commercial pressure to increase the fabrication density of phase change memory cells. Accordingly, design rules for contemporary phase change memory devices are constantly being reduced, and related fabrication pattern formation processes have migrated from photolithography processes to damascene processes. Due to these trends, the fabrication of phase change memory devices involves the processing of phase change material layers (or phase change material patterns) using a damascene process. For example, a trench of a mold oxide layer may be filled with a phase change material and then subjected to Chemical Mechanical Polishing (CMP) process(es) to form the phase change material pattern into separate nodes associated with respective unit memory cells.

Unfortunately, the fabrication processing of phase change material patterns using CMP process(es) poses several problems. First, a CMP process applied to a phase change material pattern may yield resultant structures having heights (i.e., respective upper surfaces above a substrate or other reference surface structure) that vary according to location of the wafer being processed. Indeed, differing heights for respective portions of a phase change material pattern may arise over the surface area of a single semiconductor memory chip. The fabrication of a phase change material pattern having different heights (and therefore different material thicknesses) results in different current levels (e.g., different reset current Ireset) being passed through respective phase change memory cells.

Additionally, conventional CMP processing often results in a phase change material pattern having an upper surface that is recessed in relation to a surrounding mold oxide layer. In this context, the term "recessed" means a localized concavity or depression in the upper surface of the phase change material pattern relative to the flat surface of surrounding material layer(s). The resulting recessed surface of the phase change material layer pattern has adverse consequences during later-applied fabrication processes. For example, when an electrode is formed on a recessed phase change material pattern, the electrode will have a curved shape, and this unintended curvature in shape may result in cracking of the material layer forming the electrode. Consequently, where a contact is subsequently formed on the electrode, the electrode and/or the phase change material pattern portions of the contact may be damaged.

Additionally, phase change memory devices routinely include certain contacts configured to connect an active region of a semiconductor substrate or material layer to an overlying metal layer (e.g., a wiring layer). Such contacts are formed by a conductive material layer pattern filling a contact hole formed through an interlayer insulation layer. This conductive material layer (e.g., one or more metals) is subjected to CMP processing in a manner similar to that described above with the attendant problems.

SUMMARY OF THE INVENTION

Embodiments of the present inventive concept provide relatively simplified methods of fabrication for semiconductor memory devices. However, these fabrication methods address the problems noted above in relation to polishing steps that are commonly used during damascene and contact formation processes. At a minimum, embodiments of the inventive concept provide fabrication methods that include one or more material layer polishing steps that do not yield resultant structures having heights that vary with location on a wafer or chip.

According to one aspect of the inventive concept, there is provided a method of fabricating a semiconductor device comprising; sequentially forming a first insulation layer, a second insulation layer and first sacrificial layer on a substrate, wherein the second insulation layer has a high etching selectivity relative to the first sacrificial layer, forming a first opening by sequentially etching the first sacrificial layer, the second insulation layer and the first insulation layer, depositing a first conductive material on the first sacrificial layer to a thickness sufficient to fill the first opening, polishing the first conductive material until the first sacrificial layer is exposed and a first contact formed in the first opening is electrically separated from other portions of the first conductive material, forming a second sacrificial layer on the first sacrificial layer including the first contact portion, forming a second opening by sequentially etching the second sacrificial layer, the first sacrificial layer, the second insulation layer and the first insulation layer, depositing a second conductive material on the second sacrificial layer to a thickness sufficient to fill the second opening, polishing the second conductive material until the second sacrificial layer is exposed and a second contact formed in the second opening is electrically separated from other portions of the second conductive material, removing the first sacrificial layer and the second sacrificial layer to expose resultant protruding structures of the first and second contacts extending above the second insulation layer, and thereafter polishing the resultant protruding structures using the second insulation layer as a polishing stopper layer.

According to another aspect of the inventive concept, there is provided a method of fabricating a phase change memory device, comprising; using a first polishing process, forming a first contact portion from a first conductive material extending from an active region of a substrate to an upper surface of a first sacrificial layer and sequentially passing though a first insulation layer formed on the substrate, a second insulation layer formed on the first insulation layer, a first mold insulation layer formed on the second insulation layer, and a second mold insulation layer formed on the first mold insulation layer, wherein the first and second mold insulation layers are formed from different materials and the second mold insulation layer has a high etching selectivity relative to the first sacrificial layer, using a second polishing process, forming a phase change material pattern from a second conductive material extending from a lower electrode formed in the second insulation layer and an upper surface of a second sacrificial layer formed on the first sacrificial layer and sequentially passing though the first mold insulation layer, the second mold insulation layer, and the first sacrificial layer, and thereafter removing the first and second sacrificial layers to expose resultant protruding structures of the first contact portion and the phase change material pattern extending above the second mold insulation layer and using a third polishing process, polishing the resultant protruding structures using the second mold insulation layer as a polishing stopper layer.

BRIEF DESCRIPTION OF THE DRAWINGS

The above and other features and advantages of the inventive concept will become more apparent to those skilled in the art upon consideration of certain embodiments illustrated in the attached drawings, in which.

DETAILED DESCRIPTION

Figure 1:
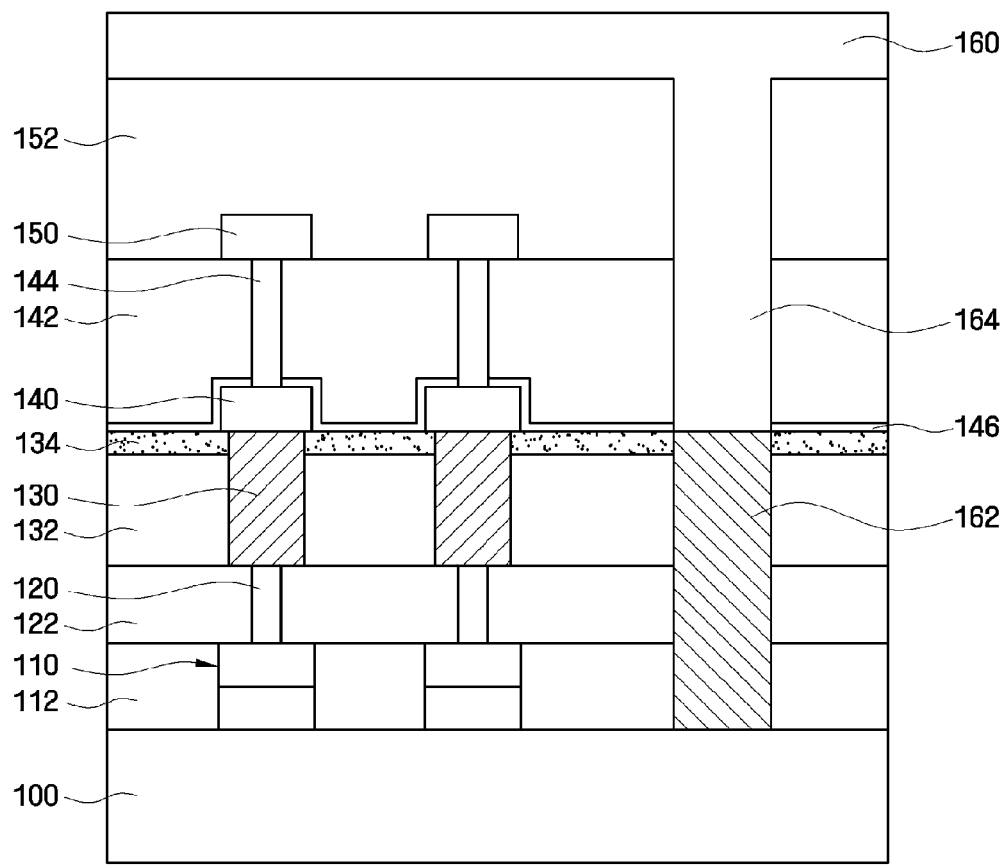
FIG. 1 is a cross-sectional view of a phase change memory device according to an embodiment of the inventive concept.

Certain embodiments of the inventive concept will now be described with reference to the accompanying drawings. However, the inventive concept may be variously embodied and should not be construed as being limited to only the illustrated embodiments. Rather, the illustrated embodiments are provided so that this disclosure will be thorough and complete and will fully convey the concept of the inventive concept to those skilled in the art.

Throughout the drawings and written description, the thickness and relative thickness of certain layers and regions may be exaggerated for clarity. Like reference numbers and labels are used to denote like or similar elements and features.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments of the inventive concept are described herein with reference to cross-section illustrations that are schematic illustrations of idealized fabrication structures. As such, certain variations in shape from those shown in the illustrations will result due to variations in fabrication techniques and/or process tolerances. Thus, embodiments of the inventive concept should not be construed as being limited to only the particular region shapes shown in the drawings. For example, certain implantations shown as clean, straight, rectangular regions will more typically be rounded or curved in feature and/or formed with a gradient edge. Likewise, certain buried regions formed by implantation may result in some implantation in the region between the buried region and the surface through which the implantation takes place. Thus, the regions shown in the drawings should be considered schematic or ideal in nature.

Hereinafter, certain embodiments of the inventive concept will be described in the context of phase change memory devices. However, the inventive concept is not limited to only the fabrication of phase change memory devices, and may be readily extended to the fabrication of other types of semiconductor devices requiring the application of one or more polishing process(es) as will be understood by those skilled in the art.

FIG. 1 is a cross-sectional view of a phase change memory device according to an embodiment of the inventive concept.

Referring to FIG. 1, the phase change memory device comprises a plurality of unit cells, wherein each unit cell comprises a diode 110 functioning as a switching element, a lower electrode 120, a phase change material pattern 130, and an upper electrode 140. These components are sequentially formed on a semiconductor substrate 100. Although FIG. 1 shows only two unit cells as working examples, those skilled in the art will understand that embodiments of the inventive concept will typically include a great plurality of unit cells. Of further note, the diode 110 may be replaced by a switching transistor, as will be readily understood by those skilled in the art.

As is generally understood in the concept of phase change memory devices, the phase change material pattern 130 undergoes a material resistance transition according to programmed state. That is, the phase change material pattern 130 may be placed in a crystalline state or an amorphous state using thermal programming techniques that pass a heating electrical current between the lower electrode 120 and upper electrode 140. The phase change material pattern 130 may be formed from one or more materials such as germanium (Ge), antimony (Sb) and tellurium (Te). For example, the phase material patterns 130 may be formed from materials including binary compound(s) such as GaSb, InSb, InSe. SbTe, or GeTe; ternary compound(s) such as GeSbTe, GaSeTe, InSbTe, $SnSb_2Te_4$, or InSbGe; and quaternary compound(s) such as AgInSbTe, (GeSn)SbTe, GeSb(SeTe), or $Te_{81}Ge_{15}Sb_2S_2$.

The lower electrode 120 and/or upper electrode 140 may be formed from a metallic material such as TiN, for example. The diode 110 connected to the lower electrode 120 may be formed by any reasonably configured junction between N-type and P-type semiconductor materials, such as those commonly formed by selective impurity doping of an active region.

However, the impurity doping of an active region under the diode 110 has a tendency to increase the sheet resistance of the active region. Therefore, in order to efficiently supply current to the active region, the phase change memory device illustrated in FIG. 1 further comprises a metal wire 160, and a contact 162/164 connecting the metal wire 160 with an active region of the semiconductor substrate 100.

Here, the contact 162/164 comprises a first contact portion 162 directly connected to the active region, and a second contact portion 164 directly connected to the metal wire 160. The first contact portion 162 is first formed, and then the second contact 164 is formed on the first contact portion 162. The contact 162/164 is formed in separate portions due to the narrow aspect ration of the contact hole formed between the upper portion of the metal wire 160 and the active region. The first contact 162 portion and the second contact portion 164 may be formed from a similar or different conductive materials, such as a metal or metal alloy like tungsten.

The upper electrode 140 may be formed from a conductive material such as a metal or metal alloy like TiN. The upper electrode 140 is connected to, for example, a bit line 150 through an upper electrode contact 144.

Mold insulation layers 132 and 134 are used to form the phase change material pattern 130 according to a damascene process, and may be formed from an oxide layer and/or a nitride layer.

Interlayer insulation layers 112, 122, 142 and 152 may be formed from (e.g.) respective oxide layer(s). In the illustrated embodiment of FIG. 1, a capping insulation layer 146 is formed over the combined upper surfaces of mold insulation layer 134 and upper electrode 140 and may be formed from a nitride layer.

The phase change memory device shown in FIG. 1 as fabricated by the method described hereafter avoids the problems associated with similar conventional fabrication approaches. That is, height differences for the respective phase change material patterns 130 and/or the first contact portions 162 that vary with location on the wafer being processed may be avoided. Further, recessing of the upper surface of the first contact portion 162 and/or the phase change material pattern 130 may be avoided in relation to the flat upper surface of surrounding mold insulation layers 132 and 134.

Hereinafter, an exemplary method of fabrication for the phase change memory device of FIG. 1 will be described in some additional detail with reference to FIGS. 2 through 9.

FIGS. 2 through 9 are related cross-sectional views sequentially illustrating the exemplary method of fabrication for a phase change memory device according to an embodiment of the inventive concept. The working substrate 100 is divided into regions A and B for ease of reference, wherein conventional fabrication approaches would unintentionally but commonly yield structures having different heights between these two regions. That is, a polishing process conventionally applied to the upper surface of materials layers formed on the semiconductor substrate 100 (e.g., as an intermediate processing step) would result in contact portions (e.g., first contact portion 162) and/or phase change material pattern 130 having different heights as between region A and region B. These specific polishing process produced elements and similar elements will be collectively referred to hereafter as "resultant polishing structures." Region A (e.g., a region relatively more centrally located on a wafer or chip) may be understood as a region wherein resultant polishing structure have relatively greater height, as compared with resultant polishing structures in B region (e.g., a region relatively more edge located on the wafer or chip).

Figure 2:
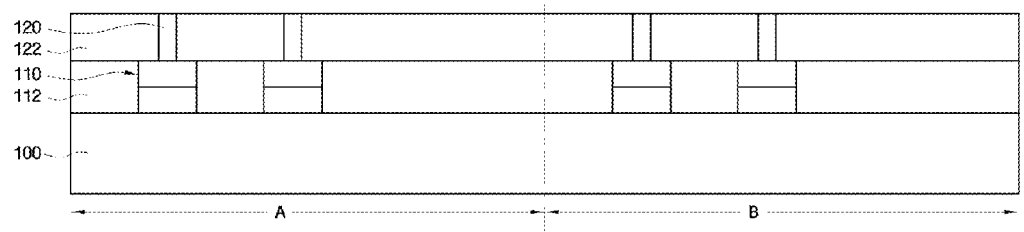
FIGS. 2 through 9 are related cross-sectional views illustrating a method of fabrication for a phase change memory device according to an embodiment of the inventive concept.

Referring to FIG. 2, the semiconductor substrate 100 is provided, and may be a silicon substrate, a silicon on insulator (SOI) substrate, a gallium arsenic substrate, a silicon germanium substrate, or the like. Although not shown, certain impurities may be selectively doped into defined active regions of the semiconductor substrate 100.

Subsequently, the diodes 110 are selectively formed through the first interlayer insulation layer 112 on the semiconductor substrate 100. The diodes 110 may be formed (e.g.,) by means of an epitaxial growth process. In certain embodiments an N-type semiconductor region forms the lower portion of each diode 110 and a P-type semiconductor region forms the upper portion.

Next, a second interlayer insulation layer 122 is formed on the diodes 110 and the respective lower electrodes 120 are formed through the second interlayer insulation layer 122 to electrically connect a corresponding diode 110.

Figure 3:
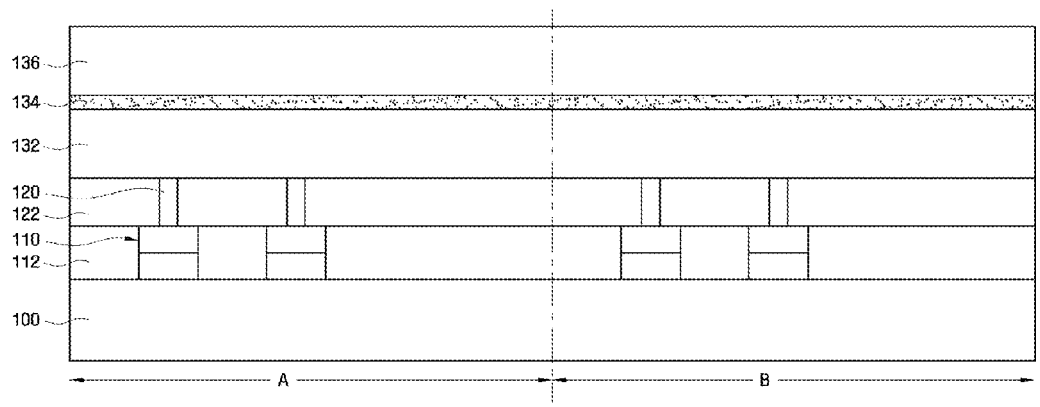

Referring to FIG. 3, a first mold insulation layer 132 and a second mold insulation layer 134 are sequentially formed on the second interlayer insulation layer 122 and lower electrodes 120. Thereafter, a first sacrificial layer 136 is formed on the second mold insulation layer 134.

Here, the first mold insulation layer 132 may be formed as part of a larger mold insulation layer, such as those commonly used in conventional damascene processes. The second mold insulation layer 134 forms another part of the larger mold insulation layer together with the first insulation layer 132, but may additionally be used as a polishing stop layer for a subsequently performed polishing process. The first sacrificial layer 136 may also be used as a polishing stop layer for a polishing process. In conventional damascene processes, the mold insulation layer is typically formed from a single oxide layer. However, certain embodiments of the inventive concept form a mold insulation layer by the combination of the first mold insulation layer 132, the second mold insulation layer 134 and the first sacrificial layer 136.

In one more specific embodiment of the inventive concept, the first mold insulation layer 132 is formed from a first oxide layer, the second mold insulation layer 134 is formed from a nitride layer, and the first sacrificial layer 136 is formed from a second oxide layer. The first and second oxide layers may be formed from similar or different oxide materials. Further, the second mold insulation layer 134 and the first sacrificial insulation layer 136 may be formed from disparate materials having a high etching selectivity with respect to each other.

Figure 4:
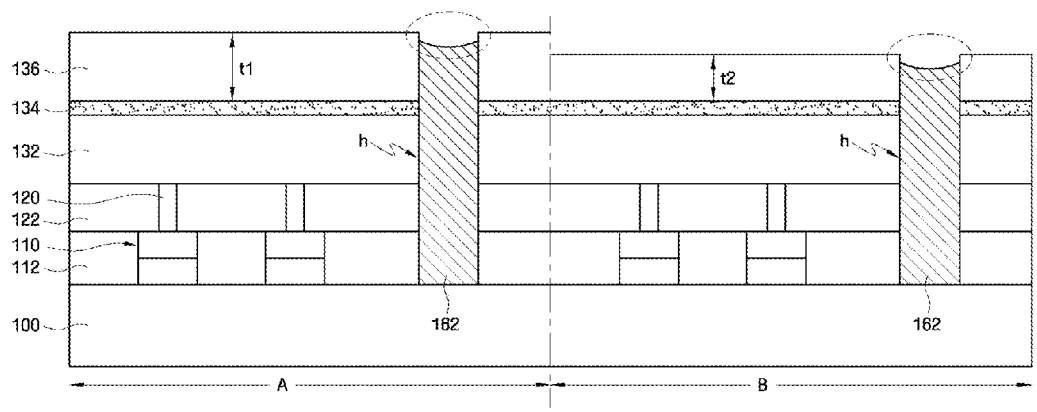

Now referring to FIG. 4, a first contact portion 162 is formed in a vertical via passing through the first sacrificial layer 136, the second mold insulation layer 134, the first mold insulation layer 132, the second interlayer insulation layer 122 and the first interlayer insulation layer 112 to expose an active region of the semiconductor substrate 100.

More specifically, a photoresist pattern (not shown) is used to locate the via in which the first contact portion 162 is formed. Then, the first sacrificial layer 136, the second mold insulation layer 134, the first mold insulation layer 132, the second interlayer insulation layer 122 and the first interlayer insulation layer 112 are sequentially etched using the photoresist pattern as an etch mask to thereby form a contact hole (h) exposing the active region of the semiconductor substrate 100.

Next, a first conductive material (e.g., a metal or metal alloy layer like tungsten) is deposited over the surface of the resultant structure including the contact hole (h) to a thickness sufficient to fill the contact hole h. Once the contact hole has been completely filled, a first polishing process (e.g., a first CMP process) is applied to the conductive material using the first sacrificial layer 136 as a polishing stop for the first polishing process. In this manner, separated first contact portions 162 may be formed that electrically contact corresponding active regions of the semiconductor substrate 100.

As described above, the resultant polishing structures in region A have relatively greater heights that the resultant polishing structures in region B. Therefore, as shown in FIG. 4, the height of the first contact portion 162 in region A is greater than the height of the first contact portion 162 in region B, because the first polishing process has removed relatively more the first sacrificial layer 136 from region B. That is, the after-polishing thickness of the first sacrificial layer 136 in region A (t1) is greater than the after-polishing thickness of the first sacrificial layer 136 in region B. Thus, the height difference between the first contact portion 162 in region A and the first contact portion 162 in region B is (t1-t2).

As also illustrated in FIG. 4, the degree of first polishing necessary to completely separate respective first contact portions 162 generally requires a certain amount of over-polishing of the first conductive material. As a result, both the first contact portions 162 in regions A and B have a recessed upper surface relative to the first sacrificial layer 136. (See portions of FIG. 4 marked with dotted lines).

Thus, the resultant polishing structures of the first polishing process are characterized by (1) heights that vary by location on the wafer or chip, and (2) recessed upper surfaces. The two topology irregularities adversely affect subsequent processes and final resultant structures within the semiconductor memory device. For example, when second contact portions 164 are formed on first contact portions 162 having different heights it is difficult to determine an etching target during an etching process used to form the second contact portion 164. Resulting defects such as non-opened first contact portions 162 may result. However, as described in relation to certain embodiments illustrated in FIGS. 5 through 8, the inventive concept avoids the problems associated with conventional fabrication processes.

Figure 5:
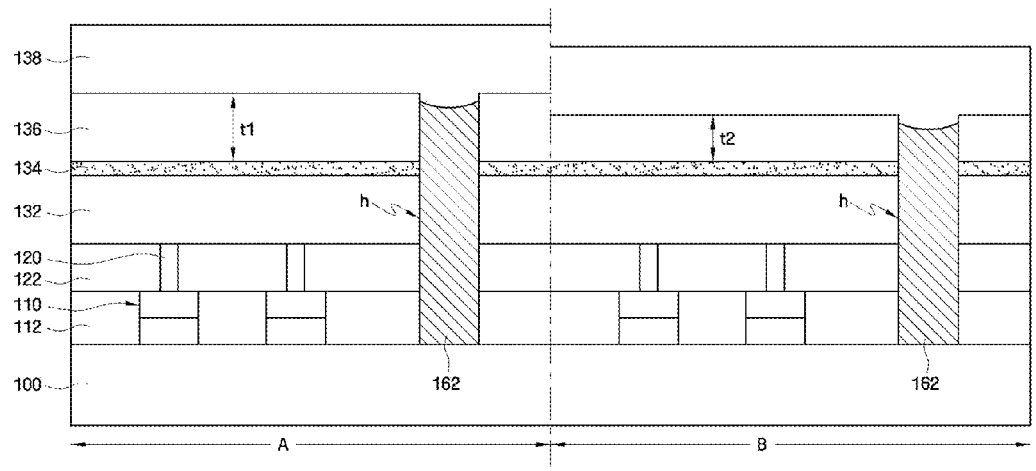

Referring now to FIG. 5, a second sacrificial layer 138 is formed on the first sacrificial layer 136 after completion of the first polishing process of FIG. 4. The second sacrificial layer 138 acts as a polishing stop layer that is used in conjunction with a second polishing process forming the phase change material pattern 130. The second sacrificial layer 138 may be formed from the same material as the first sacrificial layer 136, for example, an oxide layer.

Figure 6:
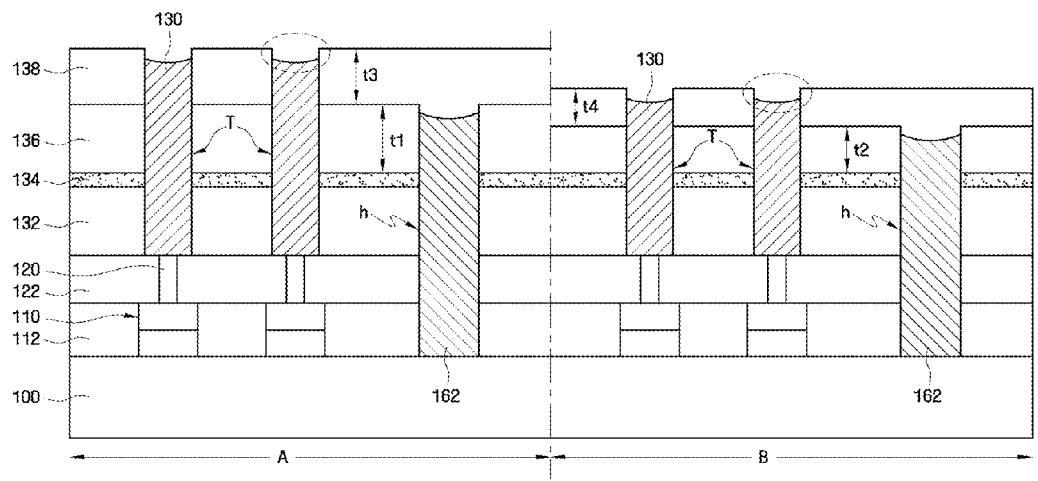

Referring to FIG. 6, the phase change material pattern 130 is formed in a vertical via (or trench) formed through the second sacrificial layer 138, the first sacrificial layer 136, the second mold insulation layer 134 and the first mold insulation layer 132 to electrically connect the lower electrodes 120.

More specifically, another photoresist pattern (not shown) defining locations for the phase change material pattern 130 is formed on the second sacrificial layer 138, and is sequentially used as an etching mask for the second sacrificial layer 138, the first sacrificial layer 136, the second mold insulation layer 134 and the first mold insulation layer 132 to form a trench T exposing at least a portion of the lower electrodes 120.

Thereafter, a phase change material is deposited on the entire surface of the resultant structure including the trench T to a thickness sufficient to fill the trench T. Then, a second polishing process (e.g., a second CMP process) is performed until the second sacrificial layer 138 is exposed, thereby forming respective portions of the phase change material pattern 130.

As before, the application of the second polishing process to regions A and B yields resultant polishing structures having different heights due to uneven polishing of the second sacrificial layer 138. Compare, resulting thicknesses t3 and t4 shown in FIG. 6. As a result, composite height differences are produced for the resultant polishing structures of the first and second polishing processes. (See, the results of t1+t3 verses t2+t4 shown in FIG. 6).

Also similar to the results of the first polishing process, the resultant polishing structures of the second polishing process have recessed upper surfaces due to a certain amount of over-polishing required to fully separate respective elements.

Thus, the results illustrated in FIG. 6 for the second polishing process include phase change material pattern 130 having heights that vary by location on the wafer or chip and having recessed upper surfaces relative to surrounding material layer(s). As before, these results adversely impact subsequent fabrication processes. For example, where the phase change material pattern 130 is recessed relative to the second sacrificial layer 138, when an upper electrode is formed on the phase change material pattern 130, cracks may form in the upper electrode. Additionally, if there is a height difference in the phase change material pattern 130 by regions, the distribution of reset currents (Ireset) may be increased.

However, as described with reference to FIGS. 7 and 8, embodiments of the inventive concept avoid these adverse outcomes. That is, in the embodiments of the inventive concept, the problems associated with the formation of the first contact portions 162 and the phase change material pattern 130 (i.e., different heights and/or recessed upper surfaces) are coincidentally addressed and remediated.

It should be noted at this point, however, that the formation of the first contact portions 162 and the formation of the phase change material pattern 130 may be reversed in order from that described above. That is to say, the first sacrificial layer 136 may be used to first form the phase change material pattern 130 and the second sacrificial layer 138 may thereafter be used to form the first contact portions 162.

Figure 7:
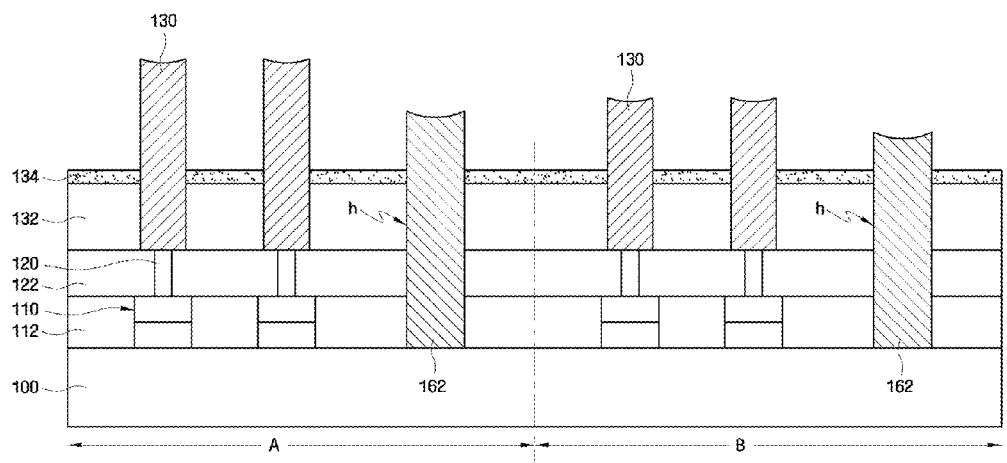

Referring now to FIG. 7, the first sacrificial layer 136 and the second sacrificial layer 138 are removed to yield a post-polishing "resultant protruding structures" corresponding to the first contact portions 162 and the phase change material pattern 130 that protrude (and are fully exposed) above the upper surface of the second mold insulation layer 134.

The removal of the first sacrificial layer 136 and second sacrificial layer 138 may be accomplished, depending on the constituent nature of the material(s) used to form these elements, using wet and/or dry etching processes. For embodiments in which the first sacrificial layer 136 and second sacrificial layer 138 are formed from the same material(s), the first sacrificial layer 136 and second sacrificial layer 138 may be removed by a single etching process. In one more specific example wherein the first and second sacrificial layers 136 and 138 are formed of an oxide layer, the first and second sacrificial layers 136 and 138 may be removed using a single wet etching process applying a LAL solution or an HF solution, or using a dry etching process applying a fluorine-base gas, such as $CH_2F_2$.

The first and second sacrificial layers 136 and 138 may be effectively removed using one or more particular etching processes since the second mold insulation layer 134 is formed from a material having a distinct etching selectivity with respect to at least the first sacrificial layer 136, such as (e.g.,) a nitride layer such as SiN when the first and second sacrificial layers 136 and 138 are formed from an oxide. As a result, the second insulation layer 134 is able to maintain its integrity throughout the removal of the first and second sacrificial layers 136 and 138.

Figure 8:
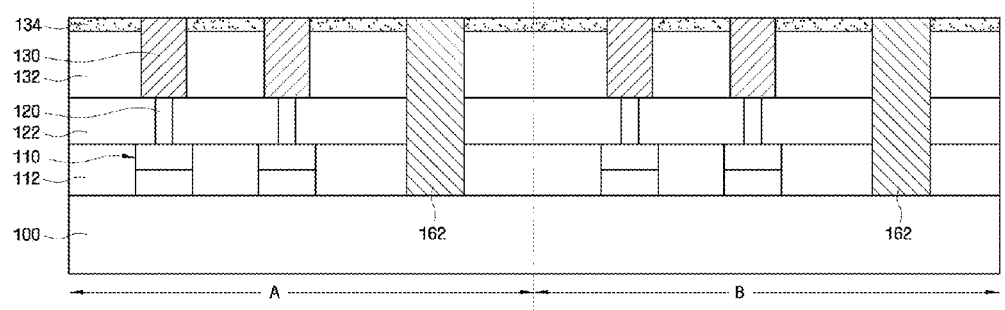

Referring to FIG. 8, a third polishing process (e.g., a CMP polishing process) is performed on the phase change material pattern 130 and the first contact portion 162 using the second mold insulation layer 134 as a polishing stop layer. In this manner, the resultant protruding structures may be removed down to the upper surface of the second insulation layer 134. As a result, the respective heights of the phase change material pattern 130 and the first contact portions 162 may be uniformly provided by a third polishing process such as a CMP or buffing process.

Of particular note, since the third polishing process is performed when the constituent portions of the phase change material pattern 130 and the first contact portions 162 are already fully separated from adjacent portions, there is no need to over-polish these structures. Instead, smooth non-recessed upper surfaces may be provided without fear of unintended short circuiting by non-removal of conductive material on the surface of the second mold insulation layer 134.

Consequently, the phase change material pattern 130 and the first contact portion 162 have the same height in both regions A and B, that is to say, a height corresponding to the upper surface of the second mold insulation layer 134. Further, the phase change material pattern 130 and the first contact 162 are not recessed relative to the second mold insulation layer 134.

Thus, as illustrated by the foregoing illustrated embodiments, it is possible to coincidentally solve certain problems associated with the two-cycle polishing necessary to form the first contact portions 162 and the phase change material pattern 130 by using a single-layered polishing stop layer (e.g., the second mold insulation layer 134). Accordingly, height differences that vary by location on the wafer or chip being processed for the first contact portions 162 and the phase change material pattern 130 may be avoided. Further, recessed upper surfaces for the phase change material pattern 130 and first contact portions 162 relative to surrounding material(s) may be avoided. Accordingly, using a relatively simple process, multiple problems are addressed and remediated in embodiments of the inventive concept. As a result, a reduction in the reset current dissipation due to an undesired decrease in the height distribution of the phase change material pattern 130 may be avoided.

Since the final resultant structures shown in FIG. 8 have flat planar upper surfaces, the corresponding unit memory cells located in regions A and B are substantially the same and have substantially similar operating properties.

Figure 9:
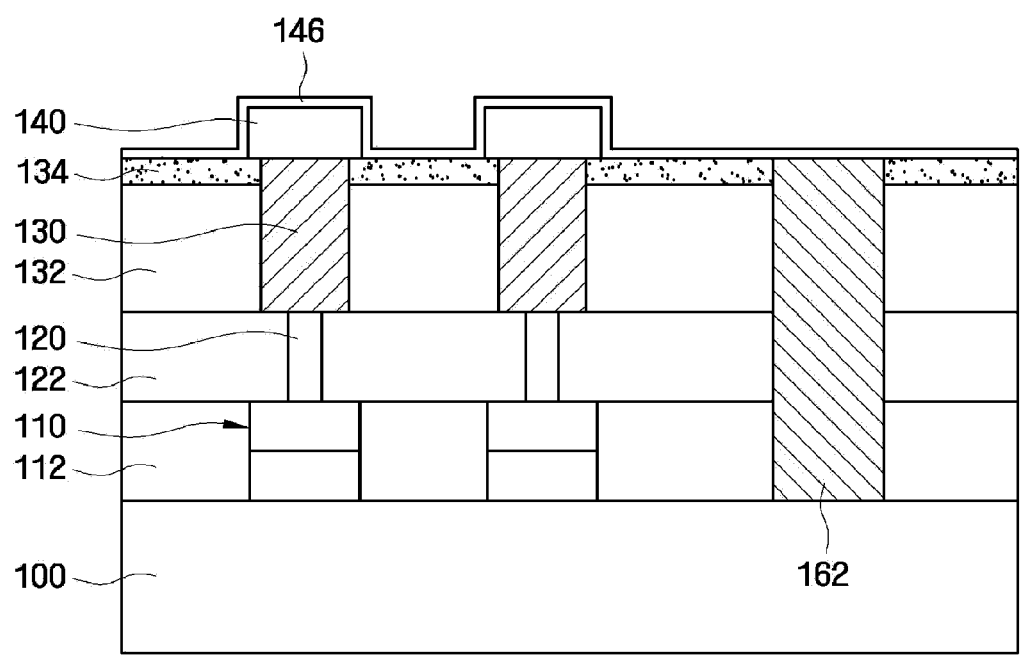

Referring to FIG. 9, the upper electrode 140 connected to the phase change material pattern 130 is formed on the final resultant structures shown in FIG. 8, and the capping insulation layer 146 is then formed over the entire surface of the resultant structure including the upper electrode 140.

More specifically, a conductive material such as a metal or metal alloy like TiN is used to form the upper electrode 140 on the final resultant structure shown in FIG. 8, and the conductive material is then patterned using a mask and an etching process to form the upper electrode 140 connected to the phase change material pattern 130. As described above, since the phase change material pattern 130 under the upper electrode 140 and surrounding regions thereof have substantially the same height, cracks do not form during the formation of the upper electrode 140. Further, when the second insulation layer 134 disposed under the upper electrode 140 is a nitride layer, it has strong resistance against the etchants commonly used to form the upper electrode 140, as compared to a conventional approaches wherein an oxide layer is exposed to such etchants. Accordingly, over-etching of the upper electrode 140 may be suppressed.

Now, the capping insulation layer 146 is formed over the entire surface of the resultant structure including the upper electrode 140. The capping insulation layer 146 may be formed of a nitride layer.

The capping insulation layer 146 serves to protect the upper electrode 140 or the first contact portion 162 during subsequently applied fabrication processes. More specifically, the upper electrode 140 may be damaged or oxidized or a surface of the first contact portion 162 may be oxidized due to a high-temperature oxidation processes used to form the third interlayer insulation layer 142 immediately after the formation of the upper electrode 140 unless the capping insulation layer 146 is provided. Particularly, if the surface of the first contact 162 is oxidized, a contact characteristic between the first contact 162 and a second contact 164 to be described later may deteriorate.

Referring back to FIG. 1, the third interlayer insulation layer 142 may now be formed on the capping insulation layer 146. Subsequently, the third interlayer insulation layer 142 and the capping insulation layer 146 are selectively etched to form a contact hole exposing the upper electrode 140, and the contact hole may be filled with a conductive material to form an upper electrode contact 144.

Next, a conductive material is deposited on the third interlayer insulation layer 142 having the upper electrode contact 144, and the conductive material is patterned to form a conductive line, for example, a bit line 150, extending in one direction.

Then, a fourth interlayer insulation layer 152 is formed on the entire surface of the resultant structure having the bit line 150.

Next, the fourth interlayer insulation layer 152, the third interlayer insulation layer 142 and the capping insulation layer 146 are selectively etched to form a contact hole exposing the first contact 162, and the contact hole is filled with a conductive material to form a second contact 164.

Subsequently, a conductive material is deposited on the fourth interlayer insulation layer 152 having the second contact 164, and the conductive material is patterned to form a metal wire 160 extending in the other direction different from the one direction in which the bit line 150 extends.

While certain embodiments of the inventive concept has been described with respect to a phase change memory device and related fabrication method, aspects of the present inventive concept are not limited thereto. It will be understood by those skilled in the art that the inventive concept may be applied to a semiconductor device including patterns of two or more different kinds, each of the patterns formed by polishing, and a fabricating method thereof. For example, the present inventive concept can be applied in a case where one type of a pattern is formed by a damascene process and the other type of a pattern is formed by a contact forming process in a different type of a memory device other than the phase change memory device. Additionally, for example, the present inventive concept can be applied in cases where one and the other types of patterns are both formed by a damascene process, or where one and the other types of patterns are both formed by a contact forming process. Further, in addition to the damascene process and the contact forming process, the present inventive concept can also be applied to all processes in which an opening is formed in an insulation layer, and a material filling the opening is deposited and polishing is then performed.

While the inventive concept has been particularly shown and described with reference to exemplary embodiments thereof, it will be understood by those of ordinary skill in the art that various changes in form and details may be made therein without departing from the scope of the inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method of fabricating a semiconductor device comprising:

sequentially forming a first insulation layer, a second insulation layer and first sacrificial layer on a substrate, wherein the second insulation layer has a high etching selectivity relative to the first sacrificial layer;

forming a first opening by sequentially etching the first sacrificial layer, the second insulation layer and the first insulation layer;

depositing a first conductive material on the first sacrificial layer to a thickness sufficient to fill the first opening;

polishing the first conductive material until the first sacrificial layer is exposed and a first contact formed in the first opening is electrically separated from other portions of the first conductive material;

forming a second sacrificial layer on the first sacrificial layer including the first contact portion;

forming a second opening by sequentially etching the second sacrificial layer, the first sacrificial layer, the second insulation layer and the first insulation layer;

depositing a second conductive material on the second sacrificial layer to a thickness sufficient to fill the second opening;

polishing the second conductive material until the second sacrificial layer is exposed and a second contact formed in the second opening is electrically separated from other portions of the second conductive material;

removing the first sacrificial layer and the second sacrificial layer to expose resultant protruding structures of the first and second contacts extending above the second insulation layer; and thereafter polishing the resultant protruding structures using the second insulation layer as a polishing stopper layer.

2. The method of claim 1, wherein the first sacrificial layer and the second sacrificial layer are formed from the same material.

3. The method of claim 2, wherein the removing of the first sacrificial layer and the second sacrificial layer is performed using at least one of a wet etching process and a dry etching process.

4. The method of claim 2, wherein the second insulation layer is formed of a nitride layer, and the first sacrificial layer and the second sacrificial layer are formed of an oxide layer.

5. The method of claim 4, wherein the first insulation layer is formed of an oxide layer.

6. The method of claim 1, wherein the polishing of the first conductive material and polishing the second conductive material are performed by a buffing process.

7. The method of claim 1, wherein the substrate is formed from a semiconductor material, and the method further comprises:

forming a first interlayer insulation layer on the substrate;

forming a switching element in the first interlayer insulation layer;

forming a second interlayer insulation layer on the first interlayer insulation layer including the switching element;

forming a lower electrode in the second interlayer insulation layer electrically connected to the switching element wherein the first contact forms a first contact portion extending from an active region of the substrate to an upper surface of the second insulation layer, and the second contact forms a phase change material pattern extending from an upper surface of the lower electrode to the upper surface of the second insulation layer, and forming the first opening further comprises etching the first and second interlayer insulation layers.

8. The method of claim 7, wherein after the polishing of the resultant protruding structures the method further comprises:

forming an upper electrode on the upper surface of the second insulation layer electrically connected to the phase change material pattern; and forming a capping insulation layer over the second insulation layer and the upper electrode.

9. The method of claim 8, wherein the capping insulation layer is formed of a nitride layer.

10. The method of claim 8, further comprising:

forming a third interlayer insulation layer on the capping insulation layer;

forming a metal wire on the third interlayer insulation layer; and forming a second contact portion extending through the third interlayer insulation layer to connect the first contact portion and the metal wire.

11. The method of claim 10, further comprising:

forming a bit line on the third interlayer insulation layer;

forming an upper electrode contact connecting the bit line with the upper electrode through the third interlayer insulation layer;

forming a fourth interlayer insulation layer on the third interlayer insulation layer including the bit line, wherein the metal wire is formed on the fourth interlayer insulation layer and the second contact portion extends through the fourth interlayer insulation layer.

12. The method of claim 7, wherein the second conductive material comprises at least one of germanium, antimony and tellurium.

13. A method of fabricating a phase change memory device, comprising:

using a first polishing process, forming a first contact portion from a first conductive material extending from an active region of a substrate to an upper surface of a first sacrificial layer and sequentially passing though a first insulation layer formed on the substrate, a second insulation layer formed on the first insulation layer, a first mold insulation layer formed on the second insulation layer, and a second mold insulation layer formed on the first mold insulation layer, wherein the first and second mold insulation layers are formed from different materials and the second mold insulation layer has a high etching selectivity relative to the first sacrificial layer;

using a second polishing process, forming a phase change material pattern from a second conductive material extending from a lower electrode formed in the second insulation layer to an upper surface of a second sacrificial layer formed on the first sacrificial layer and sequentially passing through the first mold insulation layer, the second mold insulation layer, and the first sacrificial layer; and thereafter, removing the first and second sacrificial layers to expose resultant protruding structures of the first contact portion and the phase change material pattern extending above the second mold insulation layer; and using a third polishing process, polishing the resultant protruding structures using the second mold insulation layer as a polishing stopper layer.

14. The method of claim 13, wherein the first sacrificial layer and the second sacrificial layer are similarly formed from an oxide material, and the second mold layer is formed from a nitride material.

15. The method of claim 14, wherein the removing of the first sacrificial layer and the second sacrificial layer is performed using a single etching process.

16. The method of claim 14, wherein at least one of the first, second, and third polishing processes is a Chemical Mechanical Polishing (CMP) process.

17. The method of claim 16, wherein the first polishing process over-polishes the first conductive material to ensure an electrical separation of the first contact portion from other portions of the first conductive material, the second polishing process over-polishes the second conductive material to ensure an electrical separation of the phase change material pattern from other portions of the second conductive material, and the third polishing process only polishes the resultant protruding structures to be level with the upper surface of the second mold insulation layer.

18. The method of claim 17, wherein after the polishing of the resultant protruding structures the method further comprises:

forming an upper electrode on the upper surface of the second mold insulation layer electrically connected to the phase change material pattern; and forming a capping insulation layer over the second mold insulation layer and the upper electrode.

19. The method of claim 18, wherein the capping insulation layer is formed of a nitride layer.

20. The method of claim 18, further comprising:

forming a third interlayer insulation layer on the capping insulation layer;

forming a metal wire on the third interlayer insulation layer; and forming a second contact portion extending through the third interlayer insulation layer to electrically connect the first contact portion and the metal wire.

* * * * *